United States Patent [19]
Kitamura et al.

[11] 3,876,965
[45] Apr. 8, 1975

[54] UHF-VHF COMBINATION TUNER

[75] Inventors: Nobuo Kitamura, Sagamihara; Motomu Tadama, Yokohama; Hiroaki Watanabe, Machida; Takizo Shiota; Shigeo Furuya, both of Tokyo; Hiroshi Fukagawa, Yokohama, all of Japan

[73] Assignee: Sony Corporation, Tokyo, Japan

[22] Filed: May 24, 1974

[21] Appl. No.: 473,189

Related U.S. Application Data

[63] Continuation of Ser. No. 344,988, March 26, 1973, abandoned.

[52] U.S. Cl. .................. 334/47; 325/452; 325/453; 334/15; 334/50; 334/66

[51] Int. Cl. .............................................. H03j 5/00

[58] Field of Search ............. 334/15, 47, 49, 50, 51, 334/66; 325/452, 453, 458, 464

[56] References Cited

UNITED STATES PATENTS

| | | | |
|---|---|---|---|
| 3,083,339 | 3/1963 | Bell | 334/50 X |
| 3,210,485 | 10/1965 | Ma | 334/50 X |
| 3,226,663 | 12/1965 | Eland et al. | 334/49 |
| 3,593,226 | 7/1971 | Weigel | 334/50 |
| 3,601,703 | 8/1971 | Midgley | 334/15 |

*Primary Examiner*—Alfred E. Smith
*Assistant Examiner*—Saxfield Chatmon, Jr.
*Attorney, Agent, or Firm*—Lewis H. Eslinger; Alvin Sinderbrand

[57] ABSTRACT

A UHF-VHF combination tuner is provided with a rotatable turret having a plurality of tuning segments for receiving VHF and UHF signals, respectively, which are sequentially arranged around the turret for being selectively disposed at an operative position. Each tuning segment for the VHF signal includes at least an oscillating coil which, when the respective segment is at the operative position, forms part of a local oscillator provided for conversion of the respective VHF signal to an IF signal. Each tuning segment for the UHF signal includes a potentiometer which, when the respective segment is at the operative position, controls a variable reactance element of a local oscillator provided for conversion of the respective UHF signal to an IF signal. Further, the tuning segments have rotatable pinions by which the inductance of the oscillating coil or the voltage dividing ratio of the potentiometer may be varied, as the case may be, and a fine tuning device is provided with a drive gear adjacent the operative position for driving engagement with the pinion of the tuning segment selectively disposed at the operative position.

14 Claims, 13 Drawing Figures

UHF-VHF COMBINATION TUNER

This is a continuation, of application Ser. No. 344,988, now abandoned, filed Mar. 26, 1973.

This invention relates generally to a tuner or channel selector for a television receiver, and more particularly is directed to a UHF-VHF combination tuner.

In conventional all-wave television receivers which can receive both VHF and UHF signals, separate VHF and UHF tuners are provided, with each of the tuners having a respective shaft that is turned for selecing the desired channel. In such receivers, when a UHF signal is to be received, the VHF tuner is first manipulated to the position thereof for the reception of UHF signals, and then the UHF tuner is manipulated to select or receive the desired UHF channel, that is, two operations of manipulations are required for tuning the receiver to the selected UHF channel. Since the conventional all-wave or all-channel receiver includes separate VHF and UHF tuners, the space occupied by such separate tuners is relatively large, and further the separate VHF and UHF tuners are relatively expensive.

In the UHF tuners that are generally employed, tuning is carried out continuously, that is, across the entire frequency spectrum of the UHF channels, so that tuning for a selected UHF channel cannot be achieved precisely. Although it has been proposed to provide a 70-position UHF tuner which can discretely select any one of the UHF channels from channel 14 to channel 83, inclusive, such tuner is relatively bulky, complex and costly, particularly when associated with a separate tuner for selecting the VHF channels.

Accordingly, it is an object of this invention to provide a UHF-VHF combination tuner having a single rotatable shaft by which both UHF and VHF channels can be selected.

Another object is to provide a UHF-VHF combination tuner, as aforesaid, which is capable of achieving discrete selection of VHF and UHF channels.

A further object is to provide a UHF-VHF combination tuner, as aforesaid, that is relatively small in size and inexpensive.

In accordance with an aspect of this invention, a UHF-VHF combination tuner comprises a chassis, a turret rotatable in the chassis and including first and second tuning segments for respectively receiving VHF signals and UHF signals and and which are arranged sequentially about the axis of rotation of the turret for selective disposition at an operative position in response to rotation of the turret, at least an oscillating coil in each of the first tuning segments which, when the respective segment is at the operative position, forms part of a local oscillator provided for frequency conversion of the respective VHF signal, for example, to an IF signal, and a potentiometer included in each second tuning segment which, when the respective tuning segment is disposed at the operative position, controls a variable reactance element of a local oscillator provided for frequency conversion of the respective UHF signal, for example, to an IF signal.

In an advantageous embodiment of this invention, the first and second tuning segments for receiving VHF and UHF signals, respectively, have rotatable pinions extending therefrom by which the inductance of the oscillating coil and the voltage dividing ratio of the potentiometer of the respective tuning segments may be varied, and a fine tuning device is provided with a drive gear adjacent the operative position for driving engagement with the pinion of the tuning segment selectively disposed at the operative position.

Thus, when a tuning segment for a VHF signal is disposed at the operative position, manipulation of the fine tuning device varies the inductance of the respective oscillating coil for achieving fine tuning to the respective VHF channel. On the other hand, when a tuning segment for a UHF signal is disposed at the operative position, manipulation of the same fine tuning device varies the dividing ratio of the respective potentiometer and thereby presets such tuning segment for the reception of a selected one of the UHF channels.

The above, and other objects, features and advantages of this invention, will be apparent in the following detailed description of an illustrative embodiment thereof which is to be read in connection with the accompanying drawings, wherein.

Figures 1, 6:
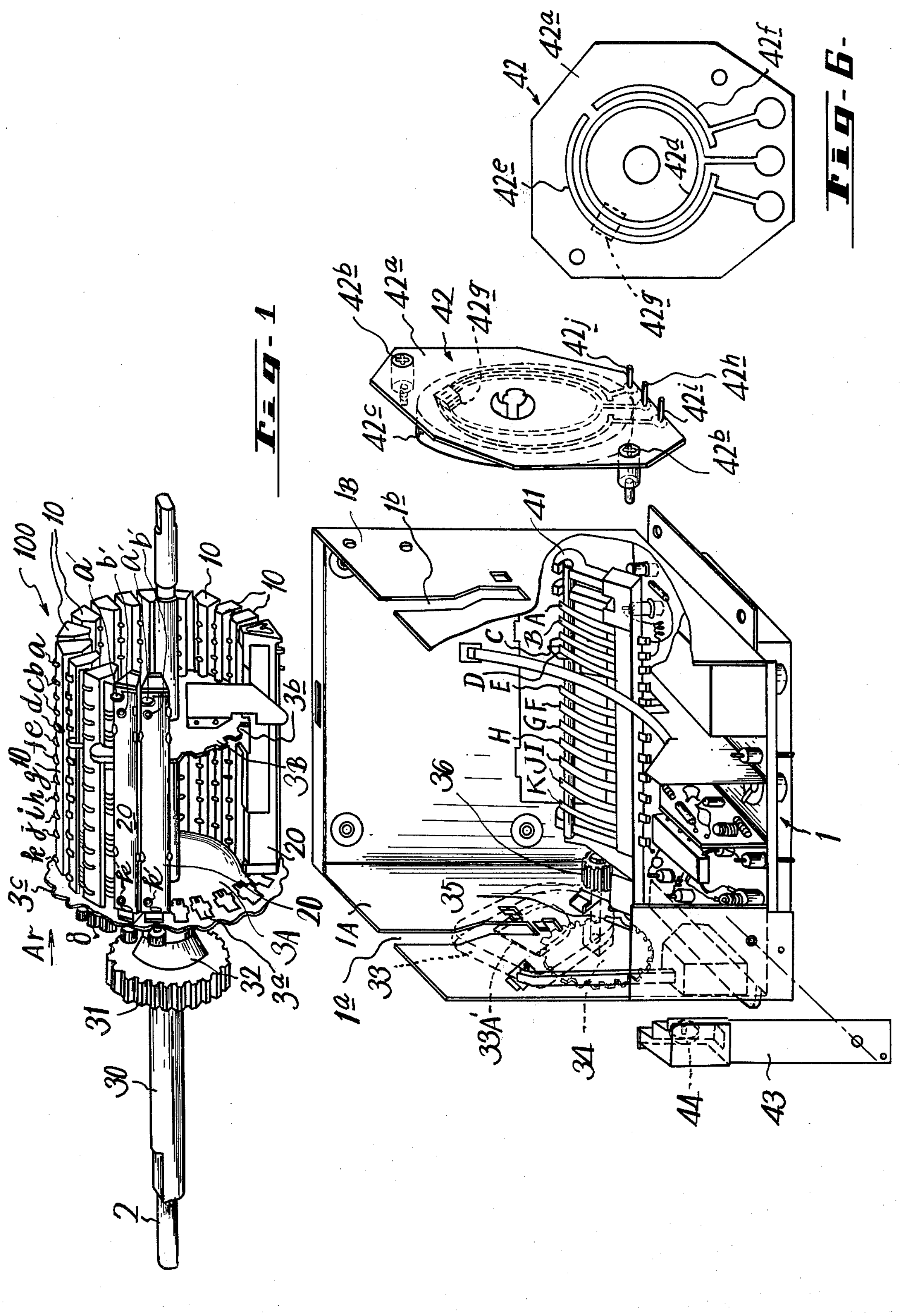
FIG. 1 is an exploded perspective view, partly broken away and in section, of a UHF-VHF combination tuner for a television receiver in accordance with an embodiment of this invention.
FIG. 6 is a detail view of a switch included in the tuner.

Referring to the drawings in detail, and initially to FIG. 1 thereof, it will be seen that the UHF-VHF combination tuner according to this invention, as there illustrated, generally comprises a chassis 1 in which a single turret 100 is rotatably mounted. The chassis 1 is shown to include spaced apart end walls 1A and 1B having slots 1*a* and 1*b*, respectively, for receiving suitable bearings (not shown) in which a channel selecting shaft 2 of turret 100 is journalled. The turret 100 is further shown to generally include disks 3A and 3B secured on shaft 2 at axially spaced apart locations between end walls 1A and 1B of the chassis, a plurality of first tuning segments 10 for receiving VHF signals and a plurality of second tuning segments 20 for receiving UHF signals. In the embodiment of FIG. 1, the turret 100 includes 12 of the first tuning segments 10 for receiving VHF signals and eight of the second tuning segments 20 for receiving UHF signals, although only three of the tuning segments 20 are shown.

Figures 3A, 3B, 3C, 4A, 4B, 4C, 4D, 4E, 7:
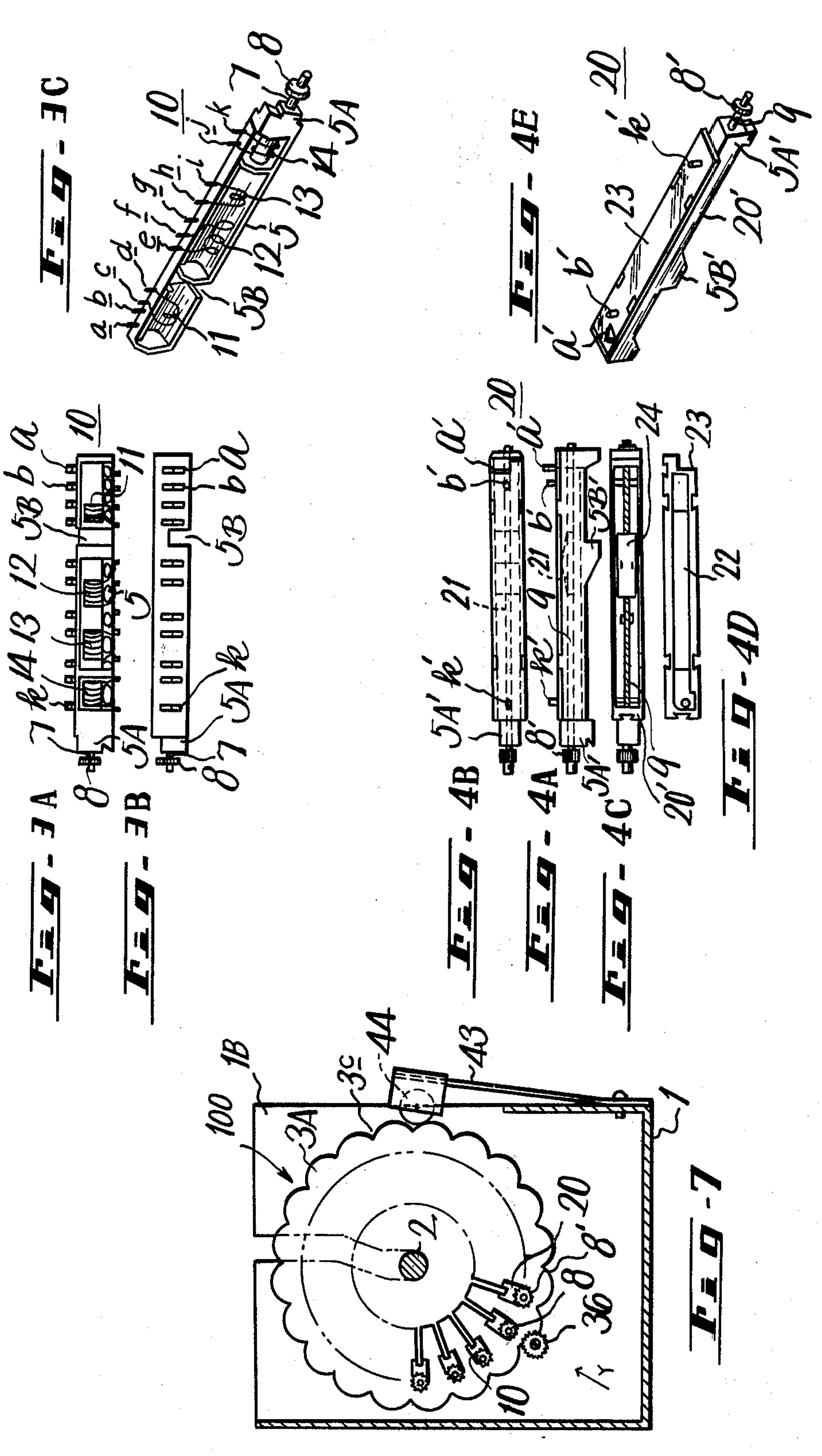
FIG. 3A, 3B and 3C are a side elevational view, a top plan view and a perspective view, respectively, of one of the tuning segments provided for receiving a VHF signal in the tuner of FIGS. 1 and 2.
FIGS. 4A, 4B, 4C, 4D and 4E are respectively a side elevational view and a top plan view of one of the tuning segments for receiving a UHF signal in the tuner of FIGS. 1 and 2, a top plan view of such tuning segment with its cover removed, a plan view of the underside of the removed cover, and a perspective view of the tuning segment for receiving a UHF signal.
FIG. 7 is an end elevational view of the turret included in the tuner, as viewed in the direction of the arrow $A_r$ on FIG. 1.

Each first tuning segment 10 includes an elongated, generally bar-shaped insulating body 5 (FIGS. 3A–3C), and each second tuning segment includes an elongated, substantially similarly bar-shaped insulating body 20'

(FIGS. 4A–4E). The elongated insulating bodies 5 and 20' are formed with mounting portions 5A and 5A', respectively, at one end, and with mounting portions 5B and 5B', respectively, adjacent their opposite end portions for engagement with openings *3a* and *3b*, respectively, that are circumferentially spaced apart in the peripheral portion of disk 3A and in the periphery of disk 3B, respectively (FIG. 1). Thus, the tuning segments 10 and the tuning segments 20 are arranged sequentially in respective groups about the axis of rotation of turret 100 defined by shaft 2 and have their elongated insulating bodies 5 and 20', respectively, supported by disks 3A and 3B so as to extend parallel to shaft 2 and be spaced radially from the latter.

As shown on FIGS. 3A–3C and FIG. 5, each of the first tuning segments 10 for receiving a VHF signal includes an antenna coil 11, coupling coils 12 and 13 and a local oscillating coil 14 mounted in cavities at spaced apart locations within the respective elongated insulating body 5, and a plurality of first contacts *a–k* which project, at longitudinally spaced apart locations, from the surface of body 5 facing radially outward on turret 100. More specifically, as shown on FIG. 5, in each of the first tuning segments 10, antenna coil 11 is connected to contacts *b*, *c* and *d*, coupling coils 12 and 13 are respectively connected to contacts *e* and *f* and to contacts *h* and *i*, and local oscillating coil 14 is connected to contacts *j* and *k*. As shown, the local oscillating coil 14 of each first tuning segment 10 is located in the end portion of the respective elongated body 5 having the mounting portion 5A thereon, that is, in the end portion of the insulating body which is adjacent disk 3A of the turret, and hence adjacent end wall 1A of the chassis when the turret is assembled in the latter. The end of each elongated body 5 having the mounting portion 5A thereon is provided with a threaded bore (not shown) through which a conductive screw 7 extends threadably into the oscillating coil 14 in the adjacent end portion of the body. The outer end of screw 7 has a pinion 8 fixed thereon (FIGS. 3A–3C) so that, when pinion 8 is rotated, as hereinafter described, screw 7 is axially displaced to extend a greater or lesser distance into the respective oscillating coil 14 for varying the inductance of the latter.

Referring now to FIGS. 4A–4E, it will be seen that each of the second tuning segments 20 contains a potentiometer generally identified by the reference numeral 21 and which is constituted by a resistor element 22 extending along the inside surface of an insulating cover 23 for the respective body 20', and by a movable contact 24 which slidably engages resistor element 22. The movable contact 24 has a threaded bore (not shown) through which a conductive screw 9 threadably extends, and the opposite end portions of screw 9 are journalled in the opposite ends of insulating body 20'. Thus, upon rotation of screw 9, contact 24 is moved axially theralong for varying the position along resistor element 22 at which the latter is engaged by contact 24. Screw 9 projects axially from the end of body 20' having mounting portion 5A' thereon, and a pinion 8' is fixed on such projecting end of screw 9 so as to be disposed adjacent end wall 1A of the chassis, similarly to the pinions 8 of the first tuning segments 10, in the assembled condition of the tuner. Second contacts *a'*, *b'* and *k'* project from each second tuning segment 20 so as to extend radially outward therefrom in the assembled turret 100, and such contact *a'*, *b'* and *k'* are spaced apart in the axial direction so as to be located similarly to the contacts *a*, *b* and *k*, respectively, on each of the first tuning segments 10. As shown particularly on FIG. 5, the contacts *b'* and *k'* of each tuning segment 20 are connected to the opposite ends of the respective resistor element 22, and the contact *a'* is electrically connected to the respective movable contact 24, for example, by way of the conductive screw 9. Thus, when screw 9 is rotated by means of the associated pinion 8', as hereinafter described, the movement of contact 24 along resistor element 22 serves to vary the voltage dividing ratio of the respective potentiometer 21.

Figures 2, 5:
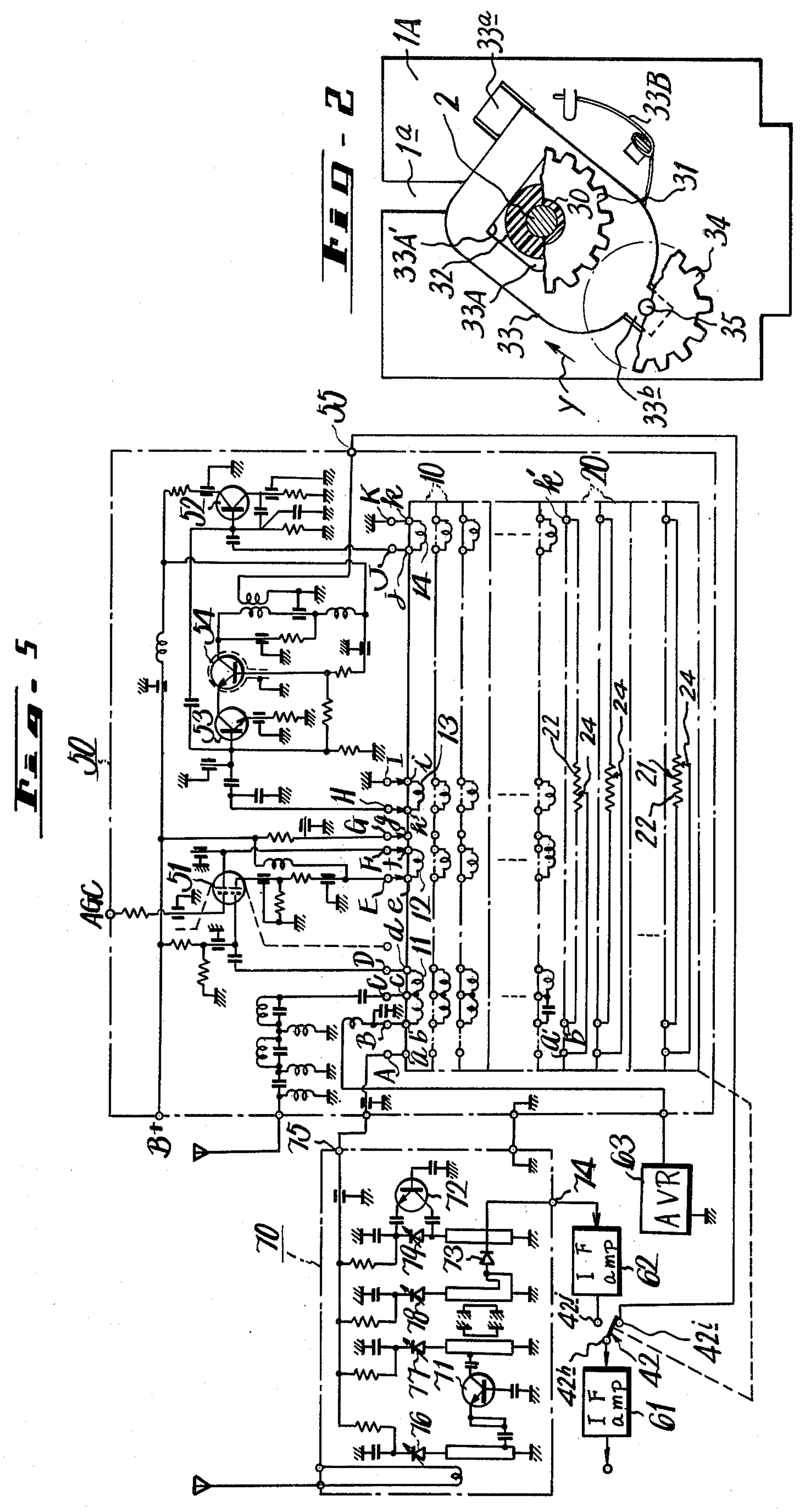
FIG. 2 is a front end elevational view of the tuner with portions thereof being shown partly broken away and in section.
FIG. 5 is a circuit diagram of the UHF and VHF tuning circuits included in the combination tuner of FIGS. 1 and 2.

Referring now to FIGS. 1 and 2, it will be seen that the tuner according to this invention further comprises a fine tuning device that includes a tubular shaft 30 of insulating material which is rotatable and axially slidable on the station selecting shaft 2 projecting forwardly from end wall 1A of the chassis. A gear 31 and a frusto-conical or tapered cam portion 32 are formed integrally with tubular shaft 20 at the end of the latter adjacent chassis end wall 1A. A slide 33 is mounted on the front face of chassis end wall 1A for movement obliquely thereto, or example, in the direction of the arrow Y on FIG. 2, by means of lugs *33a* and *33b* which extend from ends of slide 33 through suitable slots in end wall 1A. Slide 33 is further formed with a central opening 33A through which shaft 2 and tapered cam portion 32 extend, and a hair spring 33B is suitably mounted on chassis end wall 1A and engaged with slide 33 to urge the latter downwardly and thereby maintain engagement of the edge 33A' of opening 33A with the surface of tapered cam portion 32. A gear 34 is fixed on a shaft 35 which is journalled in the lower lug *33b* of slide 33 so as to dispose gear 34 for meshing engagement with gear 31, and shaft 35 projects rearwardly from lug *33b* in back of chassis end wall 1A and has a drive gear or pinion 36 fixed thereon for selective engagement with one of the pinions 8 or 8' of the tuning segments 10 and 20, respectively as hereinafter described.

The arrangement of tapered cam portion 32 and slide 33 is such that, when the force of spring 33B urges slide 33 downwardly and hence engaged edge 33A' with the relatively small diameter part of tapered cam portion 32 by reason of the resulting forward movement of tubular shaft 30 relative to selecting shaft 2, gear 34 is substantially free of gear 31 and drive gear or pinion 36 is spaced from the circular path along which pinions 8 and 8' move in response to rotation of turret 100. However, when tubular shaft 30 is displaced rearwardly on shaft 2, as by corresponding manipulation of a knob (not shown) secured to the forward end of shaft 30, tapered cam portion 32 engages a relatively large diameter part thereof with edge 33A' to move slide 33 upwardly in the direction of the arrow Y for effecting meshing engagement of gear 34 with gear 31, and for similarly displacing drive gear or pinion 36 in the direction of the arrow Y on FIG. 7 and thereby effecting meshing engagement of drive gear or pinion 36 with the pinion 8 or 8' of the tuning segment 10 or 20, respectively, which is then disposed at the operative position defined by the position of drive gear or pinion 36.

Referring again to FIGS. 1, it will be seen that an insulating support 41 is provided on the chassis 1 and supports a plurality of stationary contacts A, B, C, D, E, F, G, G, I, J and K which are spaced apart in the direction of the axis of shaft 2 and which are located adjacent the previously mentioned operative position. Thus, when one of the first tuning segments 10 is disposed at such operative position, its contacts 1–*k* are respectively engaged with the fixed contacts A–K and its pinion 8 is engageable by the drive gear or pinion 36. similarly, when one of the second tuning segments 20 is disposed at the operative position, its contacts *a'*, *b'* and *k'* are respectively engaged with the fixed contacts A, B and K and its pinion 8' is engageable by the drive gear or pinion 36.

The tuner according to this invention further comprises a switch 42 (FIGS. 1 and 6) controllable by the selecting shaft 2 to connect one or the other of VHF and UHF tuning circuits (which are hereinafter described) with the output of the tuner in dependence on the rotational position of shaft 2, that is, in dependence on whether a tuning segment 10 for receiving a VHF signal or a tuning segment 20 for receiving a UHF signal is disposed at the operative position of the tuner. More specifically, as shown, switch 42 may include an insulating plate 42*a* fixedly positioned in back of chassis end wall 1B, as by means of mounting screws 42*b*, and an insulating disk 42*c* which is suitably secured on the back end portion of shaft 2 for rotation with the latter. A continuous circular contact strip 42*d* is provided on the front surface of insulating plate 42*a* concentric with shaft 2, and arcuate contact strips 42*e* and 42*f* extend parallel to the circular contact strip 42*d* over angular extents that are respectively substantially equivalent to the angular extents of the group of first tuning segments 10 and the group of second tuning segments 20 on turret 100. The insulating disk 42*c* carries a movable bridging contact 42*g* shown in broken lines on FIGS. 1 and 6 which slidably engages the circular contact strip 42*d* and either the arcuate contact strip 42*e* or the arcuate contact strip 42f in dependance on the rotational position of turret 100. Terminals 42*h*, 42*i* and 42*j* extend from insulating plate 42*a* and are respectively connected with contact strips 42*d*, 42*e* and 42*f*. The arrangement of the movable or bridging contact 42*g* on insulating disk 42*c* is such that, when a selected one of the first tuning segments 10 is disposed at the operative position, bridging contact 42*g* rides on the arcuate contact strip 42*e* to provide an electrical connection between terminals 42*h* and 42*i*. On the other hand, when a selected one of the second tuning segments 20 is disposed at the operative position, bridging contact 42*g* rides on the arcuate contact strip 42*f* to provide an electrical connection between the terminals 42*h* and 42*j*.

In order to prevent inadvertent displacement of the turret 100 from any selected rotational position thereof, the illustrated tuner includes a detent structure constituted by a leaf spring 43 (FIGS. 1 and 7) secured at its lower end to chassis 1 and carrying a freely rotatable roller 44 at its upper end which is urged against the periphery of disk 3A having a circumferentially arranged series of notches 3*c* therein. When roller 44 engages in any one of the notches 3*c*, a respective one of the tuning segments 10 or 20 is precisely positioned at the operative position.

Referring now to FIG. 5, it will be seen that the UHF-VHF combination tuner according to this invention further comprises a VHF tuning circuit 50 and a UHF tuning circuit 70 mounted on the chassis 1, and being respectively made operative when a tuning segment 10 for receiving a VHF signal or a tuning segment 20 for receiving a UHF signal is disposed at the operative position. The VHF tuning circuit 50 is shown to include a FET 51 for RF amplifying, a transistor 52 forming part of a local oscillator, a mixing transistor 53 and a transistor 54 forming an IF amplifier which has its IF output supplied to an output terminal 55. Such output terminal 55 is connected to the terminal 42*i* of switch 42 which has its terminal 42*h* connected to the input of an IF amplifying circuit 61 that produces the tuner output. The fixed or staionary contacts C, D, E, F, G, H,, I, J AND K are suitably connected to various components of the VHF tuning circuit 50, as shown, and the stationary contact B is connected with an automatic voltage regulating circuit 63 so as to be supplied with a DC voltage therefrom.

The UHF tuning circuit 70, of which only the signal system is illustrated with the DC bias system of the circuit being omitted, is shown to include a transistor 71 for RF amplifying, a transistor 72 constituting a local oscillator and a mixing diode 73. the IF signal from the UHF tuning circuit 70 is derived at an output terminal 74 and supplied through an IF amplifying circuit 62 to the terminal 42*j* of switch 42. Thus, when turret 100 is rotationally positioned to dispose one of the second tuning segments 20 at the operative position, switch 42 is changed over from the position indicated schematically on FIG. 5 to supply the IF output of the UHF tuning circuit 70 to the IF amplifying circuit 61. In the illustrated embodiment of the invention, the UHF tuning circuit 70 is of an electronic tuning type and, for this purpose, is shown to include variable capacitance diodes 76, 77, 78 and 79 which are suitably connected to the antenna tuning circuit, the coupling tuning circuit and the local oscillating circuit so as to constitute variable reactance elements for such circuits, each of which elements is to be supplied with a control voltage from a terminal 75 of circuit 70 connected with the stationary contact A. It will be apparent that, when turret 100 is rotationally positioned to dispose a selected one of the second tuning segments 20 at the operative position, the contacts *a'*, *b'* and *k'* of the selected segment 20 engage the stationary contacts A, B and K. Thus, one end of the resistor element 22 in the selected segment 20 has the DC voltage from automatic voltage regulating circuit 63 applied thereto by way of stationary contact B, the other end of the resistor element is connected to ground by way of the stationary contact K, and the movable contact 24 of the potentiometer 21 is connected to terminal 75 by way of the stationary contact A so that the terminal 75 receives a control voltage that is determined by the position of movable contact 24, that is, by the voltage dividing ratio of the potentiometer 21.

It is to be noted that the voltage dividing ratio of the potentiometer 21 of each of the second tuning segments 20 can be varied sufficiently to provide a control voltage at the terminal 75 of circuit 70 that corresponds to the tuning of that circuit for any one of the UHF channels, for example, channels 14 to 83, inclusive. In the illustrated embodiment of the invention having eight of the second tuning segments 20, it is intended that the potentiometers 20 of those second tuning segments 200 should be preset, as hereinafter described, to provide respective control voltages at the terminal 75 which correspond to respective selected channels among the UHF channels that can be received at a particular location of the television receiver.

The above described tuner in accordance with an embodiment of this invention operates as follows:

The selecting shaft 2 is turned, as by manual rotation of a suitable knob (not shown) secured to the front end of the shaft, so as to dispose a selected one of the tuning segments 10 or 20 at the operative position where the contacts 1–*k* of the segment 10 or the contacts *a'*, *b'* and *k'* of the segment 20 engage the respective stationary contacts. If a tuning segment 10 for receiving a VHF signal is disposed at the operative position and the tubular shaft 30 is displaced rearwarly on shaft 2, the slide 33 is moved upwardly against the force of spring 33*b* by the action of tapered cam portion 32 to effect meshing engagement of gears 31 and 34, and further to engage the drive gear or pinion 36 with the pinion 8 of the selected tuning segment 10 at the operative position. If tubular shaft 30 is then turned, while being held in its rearward position on shaft 2, the rotation of shaft 30 is transmitted through meshing gears 31 and 34 to drive gear or pinion 36 and from the latter to the pinion 8 meshing therewith. The resulting rotation of the pinion 8 causes axial displacement of the respective screw 7 so that the length of the latter within the respective oscillating coil 14 is changed to vary the inductance thereof. As shown particularly on FIG. 5, the oscillating coil 14 of a tuning segment 10 disposed at the operative position is connected through stationary contact J so as to form part of the local oscillator which further includes transistor 52 in VHF tuning circuit 50. Thus, varying the inductance of the oscillating coil 14 in the tuning segment 10 at the operative position is effective to achieve fine tuning for the channel to which such tuning segment 10 corresponds. With one of the tuning segments 10 disposed at the operative position, switch 42 is effective to connect the output terminal 55 of VHF tuning circuit 50 with the IF amplifying circuit 61 so that the VHF signal of the corresponding channel is received.

When setting up the tuner for the reception of UHF signals from selected channels, the selecting shaft 2 is turned to successively position each of the second tuning segments 20 at the operative position. During the residence of each of tuning segments 20 at the operative position, tubular shaft 30 is displaced rearwardly and rotated so that, as in the case of the above described fine tuning for the reception of VHF signals, the pinion 8' of the tuning segment 20 disposed at the operative position will be rotated. As previously described, rotation of the pinion 8' will vary the voltage dividing ratio of the respective potentiometer 21 for providing a control voltage at the terminal 75 of circuit 70 which corresponds to the reception of a desired UHF channel, Thus, the several tuning segments 20 are preset for the reception of the signals of corresponding selected UHF channels. Thereafter, whenever selecting shaft 2 is turned to position a selected one of the second tuning segments 20 at the operative position, the electronic type UHF tuning ciruit 70 will be controlled to receive the respective UHF signal. Thus, the tuner according to this invention also provides for the discrete selection of UHF channels. At such time, the tubular shaft 30 may be further manipulated, as previously described, to achieve more precise or fine tuning for the selected UHF channel. Whenever the turret 100 is rotationally positioned to dispose one of the second tuning segments 20 at the operative position, the switch 42 is changed over to provide an electrical connection between its terminals 42*h* and 42*j*, and thereby to supply the output from UHF tuning circuit 70 to the IF amplifying circuit 61.

It will be apparent that, with the above described UHF-VHF combination tuner according to this invention, either UHF or VHF signals are discretely selected merely by suitable manipulation of the selecting shaft 2 so that the channel selecting operation is greatly simplified as compared with the existing conventional tuners in which separate tuners are provided for selecting VHF and UHF signals. Further, it will be seen that the complexity, cost and size of the UHF-VHF combined tuner according to this invention are substantially reduced as compared with the separate tuners previously employed for receiving the UHF and VHF signals.

In the illustrated embodiment of a UHF-VHF combined tuner according to this invention, the VHF tuner is of the turret type, that is, each of the respective tuning segments 10 includes an antenna coil 11, coupling coils 12 and 13 and an oscillating coil 14 for the respective VHF channel, as is well known in the art, while the UHF tuner is of an electronic tuning type, that is, each of the tuning segments 20 merely includes a potentiometer 21 adjusted to provide a respective control voltage for the variable reactance elements constituted by diodes 76–79, which control voltage corresponds to a UHF channel for which the respective segment 20 is preset. The reason for the foregoing is that a VHF tuner of the turret type can be suitably designed for production at a relatively low cost as compared with the cost of producing a VHF tuner of the electronic tuning type having sufficient reliability.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention.

What is claimed is:

1. A UHF-VHF combination tuner comprising: a chassis; a turret rotatable in said chassis and including a plurality of first tuning segments for receiving VHF signals and each having at least an antenna tuning coil, an oscillating coil and a plurality of first movable contacts respectively connected with said tuning coil and said oscillating coil, and a plurality of second tuning segments for receiving UHF signals and each having a potentiometer including a resistor element and a slider movable therealong and a plurality of second movable contacts connected with the ends of said resistor element and said slider, respectively, said first and second tuning segments being arranged sequentially about the axis of rotation of the turret for selective disposition at a predetermined operative position in response to rotation of said turret; stationary contact means mounted on said chassis adjacent said turret at said operative position and being selectively engageable by said first and second movable contacts in dependence on the rotational position of said turret, said stationary contact means including first and second stationary contacts which, when one of said first tuning segments is at said operative position, are engaged by said first movable contacts which are respectively connected with said antenna tuning coil and said oscillating coil, and which, when one of said second tuning segments is at said operative position, are engaged by said second movable contacts respectively connected to the ends of said resistor element, said stationary contact means further including a third stationary contact which, when one of said second tuning segments is at said operative position, is engaged by said second movable contact connected with said slider of the respective potentiometer; D.C. voltage source means connected with said first stationary contact; VHF tuning circuit means including antenna means and oscillator means connected with said stationary contact means for including said antenna tuning coil and said oscillating coil of a selected one of said first tuning segments as parts of said antenna means and said oscillator means, respectively, when said turret is rotationaloy positioned to engage said first movable contacts of said selected one of said first tuning segments with said stationary contact means; and UHF tuning circuit means of the electronic-tuning type including variable reactance means and being tunable by changes in the capacitive reactance of said variable reactance means, said variable reactance means being connected with said third stationary contact for interposing said potentiometer of a selected one of said second tuning segments between said D.C. voltage source means and said variable reactance means and thereby applying to the latter a tuning voltage which is determined by said potentiometer and, in turn, controls the capacitive reactance of said variable reactance means when said turret is rotationally positioned to engage said second movable contacts of said selected one of said second tuning segments with said stationary contact means.

2. A UHF-VHF combination tuner according to claim 1; further comprising output means, and switch means controllable by said turret for connecting said VHF tuning circuit means with said output means when said turret is rotationally positioned to engage said first movable contacts of any one of said first tuning segments with said stationary contact means and for connecting said UHF tuning circuit means with said output means when said turret is rotationally positioned to engage said second movable contacts with said stationary contact means.

3. A UHF-VHF combination tuner according to claim 1; in which said turret includes a shaft journalled in said chassis and a pair of disks fixed on said shaft and axially spaced from each other, said first and second tuning segments having respective elongated housings which extend parallel to said shaft between the peripheral portions of said disks and are supported by the latter.

4. A UHF-VHF combination tuner according to claim 1; in which each of said first and second tuning segments has respective tuning frequency varying means; and further comprising fine tuning means on said chassis for actuating said tuning frequency varying means of a selected one of said first and second tuning segments when said turret is rotationally positioned to dispose said selected tuning segment at said operative position.

5. A UHF-VHF combination tuner according to claim 1; in which each of said first and second tuning segments includes actuating means thereon for varying the tuning frequency thereof; and further comprising fine tuning means on said chassis including a drive member adjacent said operative position for engaging said actuating means of a selected one of said first and second tuning segments when said selected tuning segment is disposed at said operative position.

6. A UHF-VHF combination tuner according to claim 5; in which said drive member is constituted by a drive gear rotatably mounted adjacent said operative position, and said actuating means on each of said first and second tuning segments includes a respective pinion for meshing engagement with said gear when the respective tuning segment is disposed at said operative position.

7. A UHF-VHF combination tuner according to claim 6; in which said turret includes an axial shaft journalled in said chassis to effect rotation of said turret in response to turning of said shaft; and said fine tuning means includes a tubular shaft rotatable about the first mentioned shaft, and gear means for transmitting rotation of said tubular shaft to said drive gear.

8. A UHF-VHF combination tuner according to claim 7; in which said tubular shaft is axially movable on said first shaft, said gear means is normally disengaged, and said fine tuning means further includes means for engaging said gear means in response to axial movement of said tubular shaft relative to said first shaft.

9. A UHF-VHF combination tuner according to claim 1; in which each of said first tuning segments has inductance varying means operatively associated with the respective oscillating coil; and in which each said second tuning segment has means for moving said slider along said resistor element and thereby varying the voltage dividing ratio of said potentiometer.

10. A UHF-VHF combination tuner according to claim 9; in which each of said first tuning segments has actuating means for the respective inductance varying means, and each said second tuning segment has actuating means for said means for moving said slider of said potentiometer; and further comprising fine tuning means on said chassis including a drive member adjacent said operative position engageable with said actuating means of a selected one of said first and second tuning segments when said selected tuning segment is disposed at said operative position.

11. A UHF-VHF combination tuner according to claim 1; in which each of said first tuning segments includes a screw member which is rotatable to vary the extension thereof into the respective oscillating coil and thereby change the inductance thereof, each of said second tuning segments includes a screw member which is rotatable to displace said slider along said resistor element of said potentiometer and thereby vary the voltage dividing ratio of the latter, and each of said first and second tuning segments has a pinion on the respective screw member; and further comprising fine tuning means on said chassis including a rotatable drive gear adjacent said operative position engageable with said pinion of a selected one of said first and second tuning segments when said selected segment is at said operative position.

12. A UHF-VHF combination tuner comprising: a chassis; a turret rotatable in said chassis and including a plurality of first tuning segments for receiving VHF signals and each having an elongated insulating body arranged generally parallel to the axis of rotation of the turret, at least an antenna tuning coil and an oscillating coil contained in said insulating body and a plurality of first movable contacts extending from said body and being respectively connected with said tuning coil and said oscillating coil, and a plurality of second tuning segments for receiving UHF signals and each having an elongated substantially sealed insulating body also arranged generally parallel to said axis of rotation and containing a potentiometer including a resistor element and a slider movable therealong and a plurality of second movable contacts extending from the respective body and being connected with the ends of said resistor element and said slider, respectively, said first and second tuning segments being arranged sequentially about the axis of rotation of the turret for selective disposition at a predetermined operative position in response to rotation of said turret; stationary contact means mounted on said chassis adjacent said turret at said operative position and being selectively engageable by said first and second movable contacts in dependence on the rotational position of said turret; D.C. voltage source means connected with said stationary contact means; VHF tuning circuit means including oscillator means connected with said stationary contact means for including said oscillating coil of a selected one of said first tuning segments as part of said oscillator means when said turret is rotationally positioned to engage said first contacts of said selected one of said first tuning segments with said stationary contact means; and UHF tuning circuit means of the electronic-tuning type including variable reactance means and being tunable by changes in the capacitive reactance of said variable reactance means, said variable reactance means being connected with said stationary contact means for interposing said potentiometer of a selected one of said second tuning segments between said D.C. voltage source means and said variable reactance means and thereby applying to the latter a tuning voltage which is determined by said potentiometer and, in turn, controls the capacitive reactance of said variable reactance means when said turret is rotationally positioned to engage said second contacts of said selected one of said second tuning segments with said stationary contact means.

13. A UHF-VHF combination tuner according to claim 12, in which each of said first tuning segments includes a screw member which extends threadably into the respective insulating body to vary the extension thereof into the respective oscillating coil and thereby change the inductance of the latter in response to rotation of said screw member, each of said second tuning segments includes a screw member which is rotatable in the respective insulating body to displace said slider along said resistor element of said potentiometer and thereby vary the voltage dividing ratio of the latter, and each of said first and second tuning segments has a pinion on the respective screw member; and further comprising fine tuning means on said chassis including a rotatable drive gear adjacent said operative position engageable with said pinion of a selected one of said first and second tuning segments when said selected segment is at said operative position.

14. A UHF-VHF combination tuner according to claim 13; in which said screw member of each of said second tuning segments is axially fixed relative to the respective insulating body and threadably engaged with said slider, and said screw member of each of said second tuning segments is conductive and electrically connects said slider with the respective one of said second movable contacts.

* * * * *